(12) United States Patent
Liu et al.

(10) Patent No.: US 6,934,190 B1
(45) Date of Patent: Aug. 23, 2005

(54) RAMP SOURCE HOT-HOLE PROGRAMMING FOR TRAP BASED NON-VOLATILE MEMORY DEVICES

(75) Inventors: Zengtao Liu, Sunnyvale, CA (US); Zhizheng Liu, Sunnyvale, CA (US); Yi He, Fremont, CA (US); Sameer Haddad, San Jose, CA (US); Mark Randolph, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/863,933

(22) Filed: Jun. 9, 2004

(51) Int. Cl.[7] ............................................. G11C 16/04
(52) U.S. Cl. ............................. 365/185.19; 365/185.22
(58) Field of Search ...................... 365/185.19, 185.22, 365/185.03, 185.24

(56) References Cited

U.S. PATENT DOCUMENTS

| | | | |
|---|---|---|---|
| 5,284,784 A * | 2/1994 | Manley ....................... 438/263 |
| 6,396,741 B1 * | 5/2002 | Bloom et al. ........... 365/185.22 |
| 6,438,031 B1 * | 8/2002 | Fastow ................... 365/185.18 |
| 6,645,813 B1 | 11/2003 | Hsieh | |
| 6,664,587 B2 | 12/2003 | Guterman et al. | |
| 6,788,583 B2 * | 9/2004 | He et al. ................ 365/185.25 |

* cited by examiner

*Primary Examiner*—Vu A. Le
(74) *Attorney, Agent, or Firm*—Eschweiler & Associates, LLC

(57) ABSTRACT

Methods of operating dual bit memory devices including programming with a range of values are provided. The present invention employs a range of ramp source program pulses to iteratively perform a program operation that employs hot hole injection. The range is related to channel lengths of individual dual bit memory cells within the memory device. To program a bit of a particular dual bit memory cell, a negative gate program voltage is applied to its gate, a positive drain voltage is applied to its acting drain, and its substrate is connected to ground. Additionally, a ramp source voltage of the range of ramp source program pulses is concurrently applied to an acting source of the dual bit memory cell. A verification operation is then performed and the programming is repeated with a decremented ramp source voltage on verification failure.

26 Claims, 6 Drawing Sheets

RAMP SOURCE HOT-HOLE PROGRAMMING FOR TRAP BASED NON-VOLATILE MEMORY DEVICES

FIELD OF INVENTION

The present invention relates generally to memory devices and the like, and in particular to a method of programming non-volatile dual bit memory devices.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where single bits of data are stored in and read from respective memory cells. The cells in such structures are programmed and erased by adjusting threshold voltages of these cells by, for example, programming by hot electron injection and erasing by Fowler-Nordheim tunneling. As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer.

Individual memory cells are organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The single bit memory cell generally has a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

Another memory technology is dual bit memory, which allows multiple bits to be stored in a single cell. In this technology, a memory cell is essentially split into two substantially identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, some forms of dual bit memory cells have a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being interchanged in another arrangement. Erasing is performed as a blanket operation wherein an array or sector of cells can be simultaneously erased. Generally, a gate voltage is applied to the control gates via the wordline (s) and a drain voltage is applied to the drains via the bitlines. The sources are configured to float.

One problem that can occur in single or dual bit memory devices is that variations in device dimensions can cause devices to operate differently from each other. In particular, programming, erase, and read operations can vary due to dimensional differences. A dimension of particular concern is the channel length of dual bit memory devices. The voltages applied during programming can be significantly related to the channel length and variations thereof.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention facilitates dual bit memory device operations including programming and erasing. Programming is performed on an individual bit basis and lowers a threshold voltage for a corresponding side of a dual bit memory cell by utilizing hot hole injection. Erasing is performed as a blanket operation for multiple dual bit memory cells that raises a threshold voltage for both bits of the multiple dual bit memory cells by utilizing Fowler-Nordheim tunneling. For programming, the present invention includes methods that perform programming of dual bit memory cells that are tolerant of variations in channel length. As a result, over-programming of cells is mitigated as well as under-programming (i.e., not programmed) dual bit memory cells. The present invention employs a range of ramp source program pulses or voltages that are iteratively applied during programming. The range of pulses allows shorter channel lengths to be programmed with a more positive applied source voltage and allows longer channel lengths to be programmed with a less positive or negative applied source voltage.

A method of the present invention provides a range of ramp source program pulses for a dual bit memory device. The range is related to channel lengths of individual dual bit memory cells within the memory device. To program a bit of a particular dual bit memory cell, a negative gate program voltage is applied to its gate, a positive drain voltage is applied to its acting drain, and its substrate is connected to ground. Additionally, a ramp source voltage of the range of ramp source program pulses is applied to an acting source of the dual bit memory cell. Initially, the ramp source voltage is typically a larger or largest value of the range of ramp source program voltages. Afterward, a verify operation is performed in which a threshold voltage corresponding to the bit of the dual bit memory cell is measured to determine whether or not the bit is programmed. If the bit remains un-programmed, the bit is again programmed with similar applied voltages except that the ramp source voltage is decremented by a step value. The method continues programming until the verify operation indicates that it is programmed or the range or ramp source program pulses is complete.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
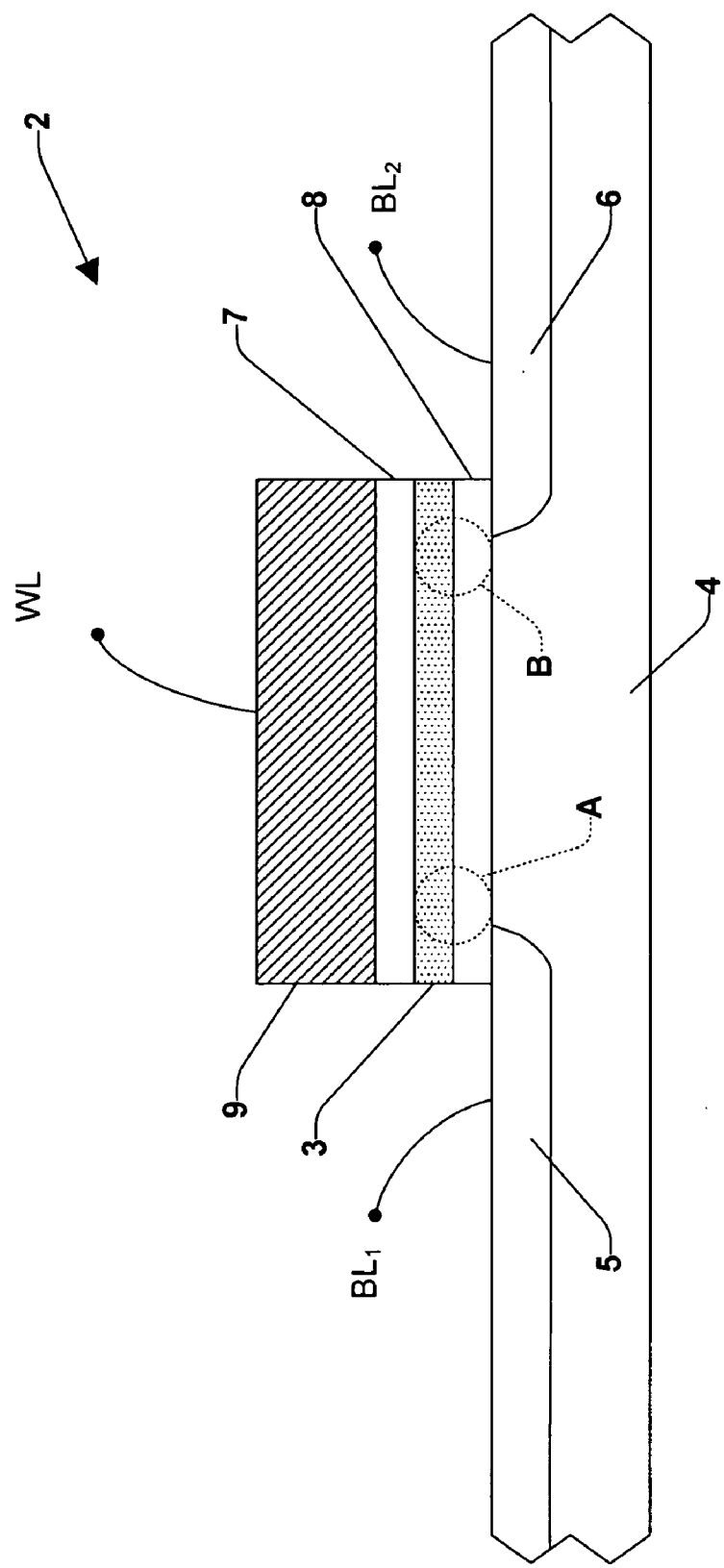
FIG. 1 is a cross sectional view illustrating a dual bit memory cell in accordance with an aspect of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

It is appreciated by the inventors of the present invention that a factor present in semiconductor fabrication of dual bit non-volatile memory devices is critical dimension (CD) control. Variations in device dimensions are typically present across a die and can cause devices to operate differently from each other. A dimension of particular concern is the channel length of dual bit memory devices. For hot hole injection based programming, variations in channel length can result in variations in required voltages that are needed to generate seed current, which is integral to the hot hole injection process. Conventionally, a static source program voltage is applied to acting sources of dual bit memory cells and the result is that some devices, shorter channel dual bit memory cells, are over-programmed and/or other devices, longer channel dual bit memory cells, are not programmed due to the channel length variations. However, the present invention employs iterative ramp source program pulses or voltages in order to mitigate over-programming of shorter channel dual bit memory cells while mitigating failed programming of longer channel dual bit memory cells.

Conventional programming operations typically increase threshold voltages of memory cells during and conventional erasing operations typically reduce threshold voltages of memory cells. However, the present invention decreases threshold voltages of memory cells during programming operations and increases threshold voltages of memory cells during erasing operations. One of the major advantages of switching the program and erase operations of conventional dual-bit memories is the reduction of power consumption by doing without the hot electron injection, which consumes a lot of power (F-N tunneling is intrinsically low current operation, thus low power; hot hole injection can be engineered to consume less power than hot electron injection as well). The ramp source programming approach of the present invention can further enhance this advantage, because shorter devices are erased with higher source bias (lower leakage current at higher source bias leads to lower power consumption), while longer devices consumes much less power than the shorter devices anyway.

Referring now to the drawings, FIG. 1 is a cross sectional view illustrating a dual bit memory cell 2 in accordance with an aspect of the present invention. The memory cell 2 comprises a charge trapping layer 3 that may comprise silicon nitride or any other type of charge trapping layer and is sandwiched between two dielectric layers of insulating material such as silicon dioxide 7 and 8. A P-type substrate 4 has implanted active regions including a first active region 5 and a second active region 6. The active regions 5 and 6 are n-type in this example and serve as source/drain regions during program, erase, and read operations.

Overlying the oxide layer 7 is a conductive gate 9. The gate 9 in one example is polysilicon and is doped, for example, with an N-type impurity (e.g., phosphorus). The memory cell 2 is capable of storing two data bits, a left bit represented by the dashed circle A and a right bit represented by the dashed circle B. The dual bit memory cell 2 is generally symmetrical, thus the active regions 5 and 6 are interchangeable as acting source and drain. Thus, the first active region 5 may serve as the source and the second active region 6 as the drain with respect to the right bit B. Likewise, the second active region 6 may serve as the source and the first active region 5 as the drain for the left bit A. Additionally, the first active region 5, the second active region 6, and the gate 9, are connected to or considered part of a first bitline $BL_1$, a second bitline $BL_2$, and a wordline WL, respectively, for operation in a memory array or device.

Conventionally, the cell 2 is programmed by increasing a threshold voltage for a bit of the cell to a value within a range of acceptable values and is erased by reducing the threshold voltage for a bit of the cell to a value within another range of acceptable values. The memory cell 2 can be conventionally programmed by applying a program voltage across the gate 9 and an acting drain region and connecting an acting source region to ground. The acting drain region is typically biased to a potential above the acting source. As a result, a high electric field is applied across the charge trapping layer 3. Due to a phenomena called "hot electron injection", electrons pass from the acting source region through a portion of the ONO layer and become trapped in the charge trapping layer 3. As a result of the trapped electrons, the threshold voltage of the memory cell is increased. In one conventional programming example, the gate is biased to 9 volts, the acting drain is biased to 5 volts, and the acting source is connected to ground. A second bit can programmed to the cell by reversing the acting source and drain and repeating the process.

In accordance with the present invention, the cell 2 is programmed by reducing a threshold value for a bit or side of the cell 2 to a range of acceptable program threshold voltage values and is erased by increasing the threshold value for a bit of the cell 2 to a value within a range of acceptable erase threshold values. Thus, in one sense, the programming and erase functions are switched from conventional methods with respect to the operations and their impact on the cell threshold voltage.

The memory cell 2 is programmed, iteratively, by applying a negative program voltage to the gate 9, applying a positive voltage to an acting drain region, connecting the substrate to ground, and applying a ramp source voltage pulse to an acting source region. The acting drain region is typically biased to a potential above the acting source. As a result, a two dimensional electric field is applied across the charge trapping layer 3. Due to a phenomena called "hot hole injection", current travels through the channel from the drain to the source and holes pass from the channel region of the substrate through a portion of the ONO layer toward the negatively biased gate 9 from the acting drain and become trapped in at a side of the charge trapping layer 3. As a result of the trapped holes, the threshold voltage for that bit and side of the memory cell 2 is decreased. The threshold voltage of the programmed bit of the cell 2 is then read to verify the programming (e.g., a program verify step). If the cell 2 is read as not being programmed (current sensed is greater than a predetermined threshold), the ramp source voltage applied to the acting source region is reduced by a step value (thereby increasing the magnitude of the drain to source voltage) and the programming is iteratively repeated until a successful read/verify is performed. In one programming example, the gate is biased to about −6 volts, the acting drain is biased to about 5 volts, the substrate is connected to ground, and the acting source is connected is iteratively biased to a voltage within a range from 1.5 to −0.7 volts, starting at 1.5 volts and a step size of 0.1 volts.

The memory cell 2 is erased by increasing the threshold voltage of the memory cell, unlike some conventional devices that erase by reducing the threshold voltage of memory cells. The memory cell 2 in one example is erased in a blanket operation that erases an array or other set of memory cells concurrently, as opposed to the program operation, which is selective or one cell at a time. To erase the cell 2, a relatively high positive gate voltage is applied to the gate 9 while the substrate, first active region 5, and the second active region 6 are connected to ground. As a result, an electric field is created that causes electrons in the substrate to migrate into the charge trapping region 3 and neutralize the trapped holes by way of Fowler-Nordheim tunneling, thereby increasing the threshold voltage of the memory cell 2.

For a read operation, a certain voltage bias is applied across an acting drain to an acting source of the cell 2. The acting drain of the cell is a bitline, which may be connected to the drains of other cells in a byte or word group. A voltage is then applied to the gate 9 (e.g., the wordline) of the memory cell 2 in order to cause a current to flow from the acting drain to the acting source. The read operation gate voltage is typically applied at a level between a programmed threshold voltage (VT) and an un-programmed or erased threshold voltage. The resulting current is measured, by which a determination is made as to the data value stored in the cell. A second bit associated with the cell can be read by reversing operations of the acting drain and the acting source.

The hot hole injection mechanism employed to program dual bit operation in accordance with the present invention is sensitive to the channel length of the memory cell 2. This mechanism requires a seed current to be generated from the drain to source to facilitate the supply of holes. The channel length is the distance between the first and second active regions 5 and 6. Shorter channel lengths typically have greater leakage current, which operates as seed current, thereby allowing a more positive voltage to be applied at the acting source during programming. Conversely, longer channel lengths have less leakage current and can require a more negative voltage to be applied at the acting source, which translates to a larger drain to source voltage, during programming in order to generate a sufficient seed current. The lower the voltage applied to the acting source, the greater the voltage potential across the channel. Generally, a longer channel length requires a relatively lower source bias voltage be applied to the acting source region, and, conversely, a relatively shorter channel length can be programmed by applying a relatively higher source bias voltage to the acting source region, for a given, fixed drain bias voltage.

Figure 2:
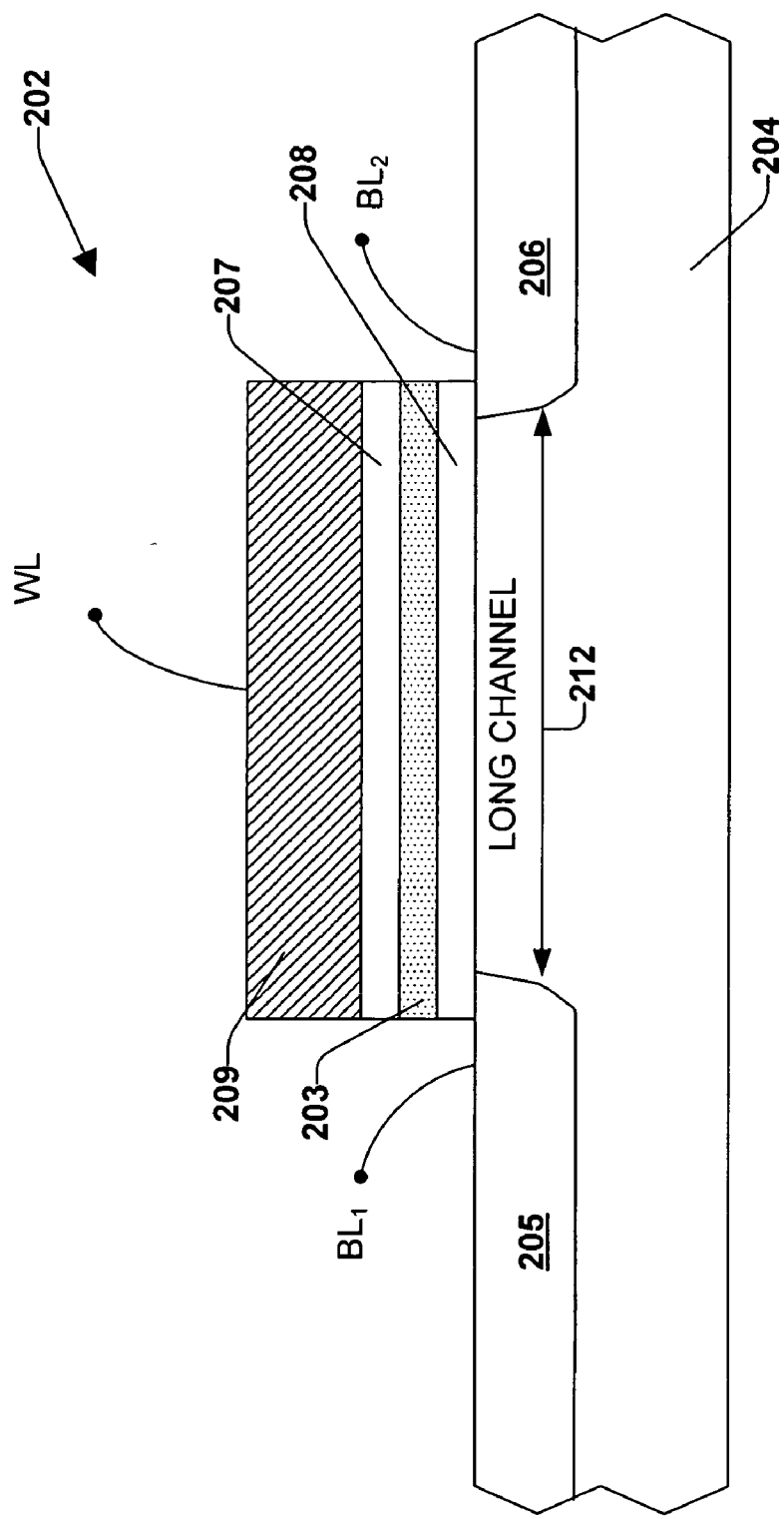
FIG. 2 is a cross sectional view illustrating a long channel dual bit memory cell in accordance with an aspect of the present invention.

FIG. 2 is a cross sectional view illustrating a long channel dual bit memory cell in accordance with an aspect of the present invention. The memory cell 202 has a channel length that is relatively longer compared with other cells (e.g., other cells on the die or device). As a result, the cell 202 requires a larger magnitude of voltage to be applied across a channel region during programming in order to generate a sufficient seed current for a hot-hole injection process.

The memory cell 202 is similar in structure to the memory cell 2 of FIG. 1 and comprises a charge trapping layer 203. The charge trapping layer 203 is typically comprised of silicon nitride or another suitable type of charge trapping layer and is sandwiched between two layers of silicon dioxide 207 and 208. The charge trapping layer 203 is suitable for hot hole injection. A P-type substrate 204 has buried active regions including a first active region 205 and a second active region 206. The active regions 205 and 206 are n-type in this example, however it is appreciated that the present invention extends to both n-type and p-type (e.g., p-type active regions) memory devices. The memory cell 202 has a relatively long channel 212 that extends between the active regions 205 and 206.

Overlying the oxide layer 207 is a polysilicon gate 209, which is doped, for example, with an N-type impurity (e.g., phosphorus). The memory cell 202 is operable to store two data bits, a left bit on a left side and a right bit on a right side. The dual bit memory cell 202 is generally symmetrical, and, as a result, the first active region 205 and the second active region 206 can act as an acting source or an acting drain during programming, erase, read, and verify operations.

The program, erase, read, and verify operations are substantially as described with respect to FIG. 1. However, the relatively longer channel length of the channel 212 requires a larger applied voltage across the active regions 205 and 206 in order to generate a suitable seed current. As a result, during programming, several iterations of program/verify (wherein the drain to source voltage increases with each iteration by lowering the source bitline bias potential by a predetermined decrement) are typically required in order to achieve a successful program operation.

Figure 3:
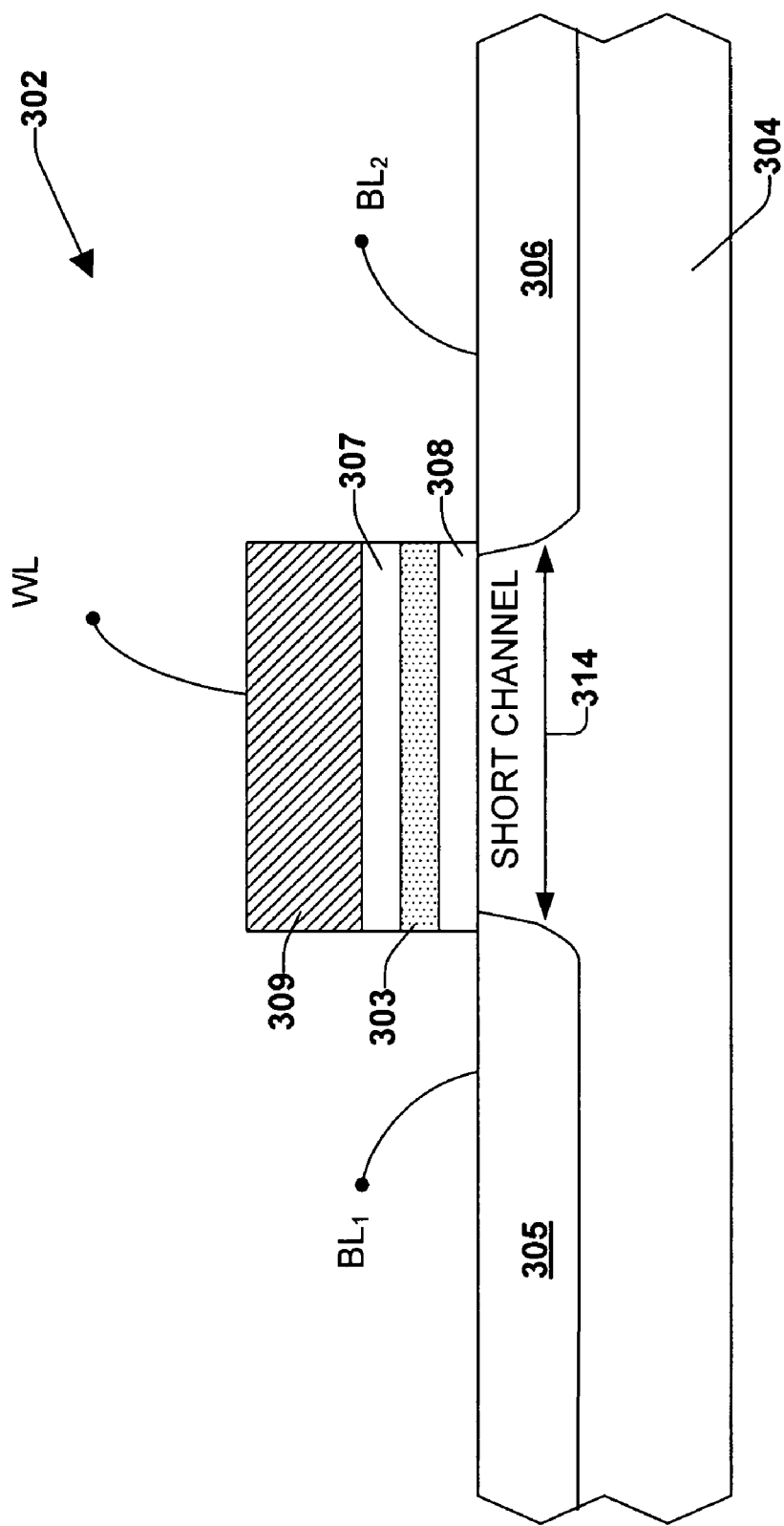
FIG. 3 is a cross sectional view illustrating a short channel dual bit memory cell in accordance with an aspect of the present invention.

FIG. 3 is a cross sectional view illustrating a short channel dual bit memory cell in accordance with an aspect of the present invention. The memory cell 302 has a channel length that is relatively short compared with other cells (e.g., other cells on the die or device). As a result, the cell 302 requires a smaller magnitude of voltage to be applied across a channel region during programming in order to generate a sufficient seed current for a hot-hole injection process.

The memory cell 302 is similar in structure to the memory cell 2 of FIG. 1 and comprises a charge trapping layer 303. The charge trapping layer 303 is typically comprised of silicon nitride or another suitable type of charge trapping layer and is sandwiched between two layers of silicon dioxide 307 and 308. The charge trapping layer 303 is suitable for hot hole injection. A P-type substrate 304 has buried active regions including a first active region 305 and a second active region 306. The active regions 305 and 306 are n-type in this example, however it is appreciated that the present invention extends to both n-type and p-type (e.g., p-type active regions) memory devices. The memory cell 302 has a relatively short channel 314 that extends between the active regions 305 and 306.

Overlying the oxide layer 307 is a polysilicon gate 309, which is doped, for example, with an N-type impurity (e.g., phosphorus). The memory cell 302 is operable to store two data bits, a left bit on a left side and a right bit on a right side. The dual bit memory cell 302 is generally symmetrical, and, as a result, the first active region 305 and the second active region 306 can act as an acting source or an acting drain during programming, erase, read, and verify operations.

The program, erase, read, and verify operations are substantially as described with respect to FIG. 1. However, the relatively smaller/shorter channel length of the channel 314 requires a smaller applied voltage across the active regions 305 and 306 in order to generate a suitable seed current. As a result, during programming, a relatively small number of iterations of program/verify operations (e.g., 1) may be required in order to achieve a successful program operation.

Whether a given memory cell on a memory device has a short or long channel length depends upon the fabrication process employed. Generally, memory cells are fabricated with an acceptable range of tolerances for different device dimensions. For dual bit memory cells, a key dimension is the channel length. As a result, a memory device can have an expected range of channel length variations across a given die. This range is employed to derive an acceptable range of program voltages or pulses for the program operation. Generally, an upper limit of the range corresponds to a smaller drain to source voltage and a minimum expected channel length and a lower limit of the range of program voltages corresponds to a maximum expected channel length. Accordingly, the acceptable range of program voltages for ramp source programming depends upon expected or actual device dimensions.

Figure 4:
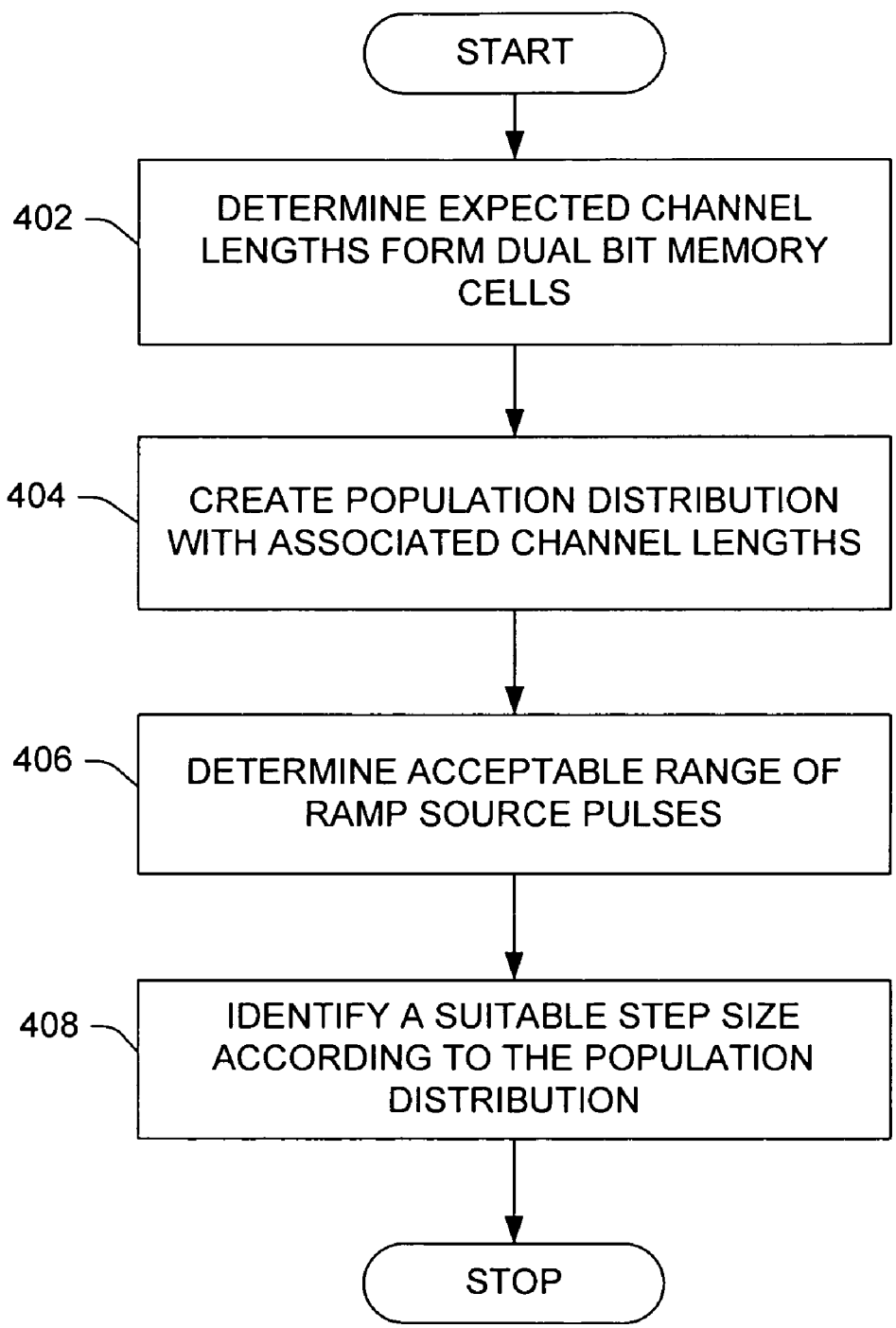
FIG. 4 is a flow diagram illustrating a method of configuring a programming operation of a dual bit memory device comprising a number of dual bit memory cells in accordance with an aspect of the present invention.
Figure 5:
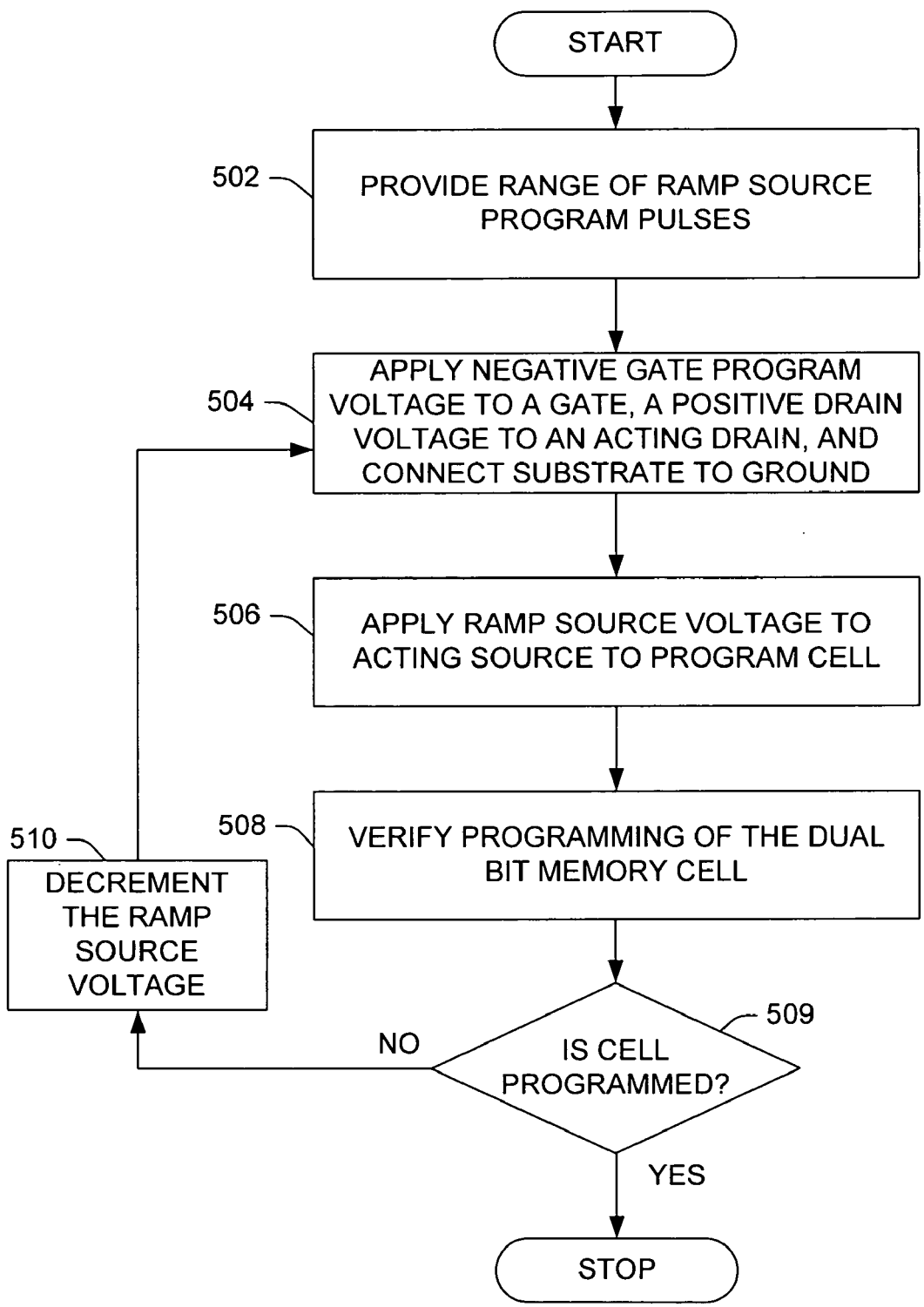
FIG. 5 is a flow diagram illustrating a method of programming a memory device in accordance with an aspect of the present invention.
Figure 6:
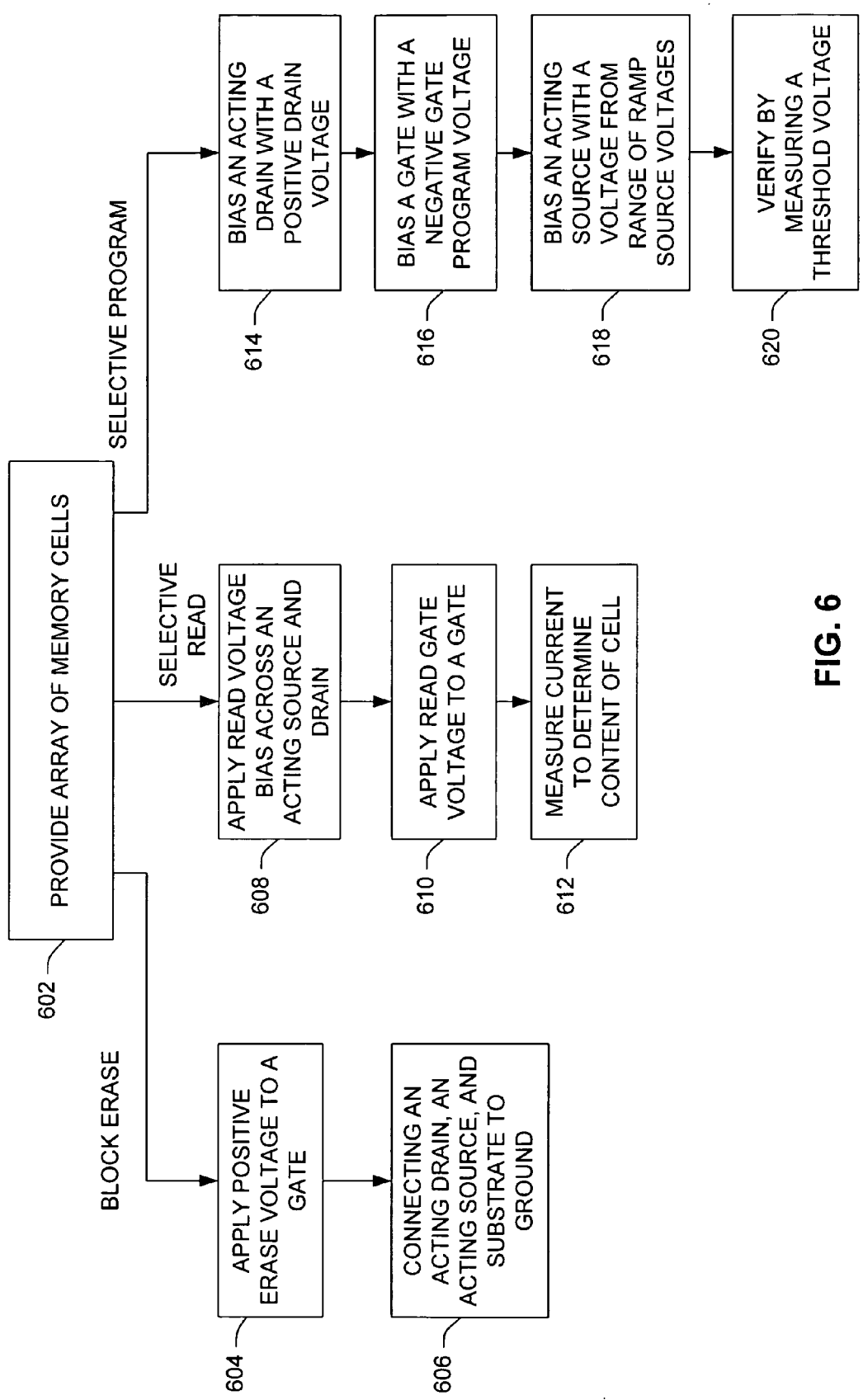
FIG. 6 is a flow diagram illustrating a method of operating a memory device in accordance with an aspect of the present invention.

In view of the foregoing structural and functional features described supra, methodologies in accordance with various aspects of the present invention will be better appreciated with reference to FIGS. 1, 2, and 3. While, for purposes of simplicity of explanation, the methodologies of FIGS. 4, 5, and 6 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect of the present invention.

FIG. 4 is a flow diagram illustrating a method of configuring a programming operation of a dual bit memory device comprising a number of dual bit memory cells in accordance with an aspect of the present invention. The method identifies a suitable range of ramp source program voltages and a step size for programming operations. The suitable range is related to expected or actual channel lengths of memory devices on a die or device. The step size is selected to identify a suitable source program voltage for the memory device while mitigating or preventing too large of a voltage being applied across a channel region of the device.

The method begins at block 402, wherein expected and/or actual channel lengths for dual bit memory cells of a memory device or die are determined. Typically, an allowable range of device dimensions result in an expected range or tolerance of channel length values. For example, maximum channel length, average, and minimum channel length can be determined and/or derived, for example, based on a characterization of the fabrication process. A population distribution is also be created that identifies numbers of dual bit memory cells with associated channel lengths at block 404. An acceptable range of ramp source program voltages or pulses is then determined at block 406 according to the determined channel lengths for the memory device. Continuing, a suitable step size is identified at block 408 at least in part according to the created population distribution. For example, if a relatively large number of the cells are toward the shorter channel length, a smaller step size can be tolerated without substantially reducing the programming speed of the device.

It is appreciated that variations of this method and other similar methods that derive suitable ranges and step values for ramp source program voltages or pulses are contemplated in accordance with the present invention.

FIG. 5 is a flow diagram illustrating a method of programming a memory device in accordance with an aspect of the present invention. The method employs ramp source program pulses as a mechanism to program dual bit memory cells while mitigating damage from over programming the dual bit memory cells.

Conventional programming operations typically increase threshold voltages of memory cells during and conventional erasing operations typically reduce threshold voltages of memory cells. However, the present invention decreases threshold voltages of memory cells during programming operations and increases threshold voltages of memory cells during erasing operations. One of the major advantages of switching the program and erase operations of conventional dual-bit memories is the reduction of power consumption by doing without the hot electron injection, which consumes a lot of power (F-N tunneling is intrinsically low current operation, thus low power; hot hole injection can be engineered to consume less power than hot electron injection as well). The ramp source programming approach of the present invention can further enhance this advantage, because shorter devices are erased with higher source bias (lower leakage current at higher source bias leads to lower power consumption), while longer devices consumes much less power than the shorter devices anyway.

The method begins at block 502 wherein a set or range of ramp source program pulses or voltages is provided. The range can be obtained as described above or in another suitable manner. An exemplary suitable range of ramp source program pulses is −0.7 to +1.5 volts. A negative gate program voltage is applied to a gate of a dual bit memory device, a positive drain program voltage is applied to an acting drain of the dual bit memory device, and a substrate is connected to ground at block 504. Some exemplary values for the gate program voltage and the positive drain program voltage are −6 volts and +6 volts, respectively. A ramp source program pulse of the range of ramp source program pulses is applied to an acting source of the dual bit memory device at block 506. Initially, the ramp source program pulse is a largest voltage of the range of ramp source program pulses (e.g., 1.5 volts). Generally, the application of the ramp source program pulse, the gate program voltage, and the positive drain program voltage are applied for a determined and/or selected period of time that can vary upon implementation. Subsequently, a verify operation is performed in which a threshold voltage for a side of the dual bit memory device at block 508 is checked. On the verify operation being successful at 509, the method ends. Otherwise, the ramp source program pulse is decremented by a step value at block 510 and the method returns to block 504. A suitable exemplary step size is 0.1 volts; therefore the next source bias voltage is 1.4 volts, thereby decrementing the drain to source voltage bias by 0.1 volts and the process is repeated until the cell is programmed or until the next source bias voltage exits the range of acceptable values.

FIG. 6 is a flow diagram illustrating a method of operating a memory device in accordance with an aspect of the present invention. The method performs read operations, program operations, and erase operations on an array of memory cells on the memory device.

The method begins at block 602 wherein a memory device is provided that comprises an array of memory cells. The memory cells are individually addressable so that selected voltages can be applied to respective acting sources, acting drains, and gates via a first bitline, a second bitline, and a wordline.

On a block erase operation, the memory cells of the array are erased by raising their respective threshold voltages (Vt). A positive erase gate voltage (e.g., 18 volts) is applied to the gates of the array at block 604 and the active regions and substrate are connected to ground at block 606. As a result, an electric field is created in memory cells of the array that cause electrons in the substrate to migrate into the charge trapping regions and neutralize the trapped holes by way of Fowler-Nordheim tunneling thereby increasing the threshold voltage of the memory cells.

On a selective read operation, a single bit is read by a presence or absence of significant current during the read operation of a selected memory cell. A read voltage bias is applied across an acting source and an acting drain of the selected memory cell at block 608. A read gate voltage is applied to the gate of the selected memory cell at block 610. The read gate voltage is at a value greater than the programmed threshold voltage and below the erased threshold voltage. Then, a resulting source drain current is measured in order to determine a value of the memory cell at block 612. The measured current can indicate a logical value for that bit of the memory cell. Generally, a measured current above a threshold value indicates one logical value and a measured current below the threshold value indicates an opposite logical value.

On a program operation, a single bit of a selected memory cell is programmed by an iterative ramp source voltage or pulse. The ramp source pulse is selected from a range of ramp source program pulses and is employed iteratively with hot hole injection to program the single bit of a selected individual memory cell. The hot hole injection mechanism employed is sensitive to a channel length of the selected memory cell. The selective program begins by biasing an acting drain of the selected memory cell a positive drain voltage (e.g., about 6 volts) at block 614. A gate of the selected memory cell is biased to a negative gate voltage (e.g., about −6 volts) at block 616. Generally, a substrate is connected to ground. An acting source is initially biased to an initial voltage of the range of ramp source program pulses at block 618. The initial or first value of the ramp source pulse is typically a largest value of the range of ramp source program pulses. A verify operation is then performed at block 620 be measuring a threshold voltage of a side of the selected dual bit memory cell. It is appreciated that programming reduces a threshold voltage of a side of the memory cell that corresponds to the single bit. As a result, if the measured threshold voltage is above a determined value, the single bit of the selected memory cell remains un-programmed. Conversely, if the measured threshold voltage is below the determined value, the bit of the selected memory cell is deemed programmed. If the bit is not programmed, the initial voltage is decremented by a suitable step value and the program operation is repeated with the new ramp source voltage value.

This mechanism for programming requires a seed current to be generated from the drain to source to facilitate the supply of holes. The channel length is the distance between the first and second active regions (acting source and drain) of the selected memory cell. Shorter channel lengths typically have greater leakage current, which operates as seed current thereby allowing a more positive voltage to be applied at the acting source during programming. Conversely, longer channel lengths have less leakage current and can require a more negative voltage to be applied at the acting source during programming in order to generate a sufficient seed current. The lower the voltage applied to the acting source, the greater the voltage potential across the channel. Generally, a longer channel length requires a relatively lower source bias voltage be applied to the acting source region, and, conversely, a relatively shorter channel length can be programmed by applying a relatively higher source bias voltage to the acting source region.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of programming a bit of a dual bit memory device comprising:
   applying a negative gate program voltage to a gate of the memory device;
   applying a drain program voltage to an acting drain of the memory device; and
   iteratively applying a range of ramp source voltages to an acting source of the memory device.

2. The method of claim 1, wherein applying the range of ramp source voltages comprises:
   selecting an initial value as a ramp source voltage;
   applying the ramp source voltage to the acting source of the memory device;
   verifying the program operation; and
   on failure of verification, reducing the ramp source voltage by a step value and re-applying the ramp source voltage to the acting source, re-applying the gate program voltage to the gate, and re-applying the drain program voltage to the acting drain.

3. The method of claim 1, further comprising selecting a wordline to provide the negative gate program voltage, selecting a first bitline to provide the drain program voltage to the acting drain, and selecting a second bitline to provide the range of ramp source voltages to the acting source.

4. The method of claim 1, further comprising selecting a first active region of the memory device as the acting source and a second active region as the acting drain associated with a first bit of the memory device.

5. The method of claim 1, further comprising selecting a second active region of the memory device as the acting source and a first active region as the acting drain associated with a second bit of the memory device.

6. The method of claim 1, further comprising selecting the range of ramp source voltages according to expected channel lengths.

7. The method of claim 1, wherein the applied negative gate program voltage is about −9 volts.

8. The method of claim 1, wherein the applied drain program voltage is about 6 volts.

9. The method of claim 1, wherein the range of ramp source voltages is about −0.7 volts to 1.5 volts.

10. The method of claim 2, wherein the step size is about 0.1 volts.

11. A method of operating an array of dual bit memory cells comprising:
    selecting a dual bit memory cell of the array and selecting a bit of the dual bit memory cell;
    selecting a first active region of the dual bit memory cell as an acting source for the selected bit and selecting a second active region of the dual bit memory cell as an acting drain; and
    programming the selected bit of the dual bit memory cell by iteratively applying a range of ramp source program voltages and employing hot hole injection.

12. The method of claim 11, wherein programming the selected bit of the dual bit memory cell comprises iteratively applying a ramp source voltage of the range of ramp source program voltages to the acting source, applying a positive drain voltage to the acting drain, and applying a negative gate program voltage to a gate of the dual bit memory device.

13. The method of claim 11, wherein the ramp source voltage is obtained by decrementing a previous ramp source voltage by a step value.

14. The method of claim 12, further comprising verifying the programming of the selected bit after applying the ramp source voltage.

15. The method of claim 14, wherein verifying the programming comprises measuring a threshold voltage for a side of the selected dual bit memory device that corresponds to the selected bit and comparing the measured threshold voltage with a range of acceptable program threshold voltages.

16. The method of claim 11, further comprising reading the selected bit of the dual bit memory cell by applying a read voltage bias across the acting source and the acting drain regions, applying a read gate voltage to a gate of the dual bit memory cell, and measuring source-drain current to determine content of the selected bit.

17. The method of claim 11, further comprising performing a block erase on the array of dual bit memory cells by applying a positive erase voltage to gates and connecting active regions and substrate to ground.

18. A method of configuring programming operation for a number of dual bit memory cells comprising:
   determining channel lengths for the number of dual bit memory cells;
   creating a population distribution associating the channel lengths with the number of dual bit memory cells; and
   determining an acceptable range of ramp source pulses for programming of the number of dual bit memory cells.

19. The method of claim 18, further comprising identifying a suitable step size at least partly according to the population distribution.

20. The method of claim 18, wherein determining channel lengths comprises identifying allowable channel lengths for the number of dual bit memory cells.

21. The method of claim 18, wherein determining channel lengths comprises measuring dimensions of one or more of the number of dual bit memory cells.

22. The method of claim 18, wherein determining the acceptable range of ramp source pulses comprises identifying a first ramp program voltage corresponding to a largest channel length and identifying a second ramp program voltage corresponding to a smallest channel length.

23. The method of claim 18, wherein the channel lengths include actual and expected channel lengths.

24. The method of claim 19, wherein identifying the suitable step size is further comprises analyzing desired speed of operation.

25. A method of programming a bit of a dual bit memory device comprising:
   applying a negative gate program voltage to a gate of the memory device;
   applying a drain to source voltage across an acting drain and an acting source of the memory device concurrent to applying the negative gate program voltage;
   verifying the programming of the bit; and
   on failure of verification, incrementing the drain to source voltage by a step value, re-applying the negative gate program voltage, re-applying the incremented drain to source voltage, and re-verifying the programming of the bit until a successful verification.

26. The method of claim 25, wherein incrementing the drain to source voltage comprises decrementing an applied ramp source program voltage to the acting drain.

* * * * *